US012650454B2

(12) United States Patent
Ha et al.

(10) Patent No.: US 12,650,454 B2
(45) Date of Patent: Jun. 9, 2026

(54) SYSTEMS AND METHODS FOR DETERMINING A DISTANCE TO A FAULT IN A POWER SYSTEMS NETWORK

(71) Applicant: General Electric Technology GmbH, Baden (CH)

(72) Inventors: Hengxu Ha, Stafford (GB); Xiaoming Li, Stafford (GB)

(73) Assignee: GE VERNOVA INFRASTRUCTURE TECHNOLOGY LLC, Greenville, SC (US)

( * ) Notice: Subject to any disclaimer, the term of this patent is extended or adjusted under 35 U.S.C. 154(b) by 557 days.

(21) Appl. No.: 18/188,219

(22) Filed: Mar. 22, 2023

(65) Prior Publication Data

US 2024/0319252 A1 Sep. 26, 2024

(51) Int. Cl.
*G01R 31/08* (2020.01)

(52) U.S. Cl.
CPC ......... *G01R 31/088* (2013.01); *G01R 31/086* (2013.01)

(58) Field of Classification Search
CPC ............................ G01R 31/088; G01R 31/086
See application file for complete search history.

(56) References Cited

U.S. PATENT DOCUMENTS

| | | | |
|---|---|---|---|
| 10,637,233 B2 | 4/2020 | Hao | |
| 11,162,994 B2 | 11/2021 | Hao | |
| 2010/0225329 A1* | 9/2010 | Akke | H02H 3/402 |
| | | | 324/525 |
| 2010/0332040 A1* | 12/2010 | Garcia | F03D 7/048 |
| | | | 290/44 |
| 2011/0082653 A1* | 4/2011 | Balcerek | G01R 31/088 |
| | | | 702/59 |
| 2017/0315168 A1* | 11/2017 | Benmouyal | G01R 31/085 |

FOREIGN PATENT DOCUMENTS

| | | | |
|---|---|---|---|
| EP | 3560054 A1 | 10/2019 | |
| WO | WO-2019229638 A1 * | 12/2019 | G01R 31/52 |

OTHER PUBLICATIONS

International Search Report and Written Opinion for PCT/US2024/018112, dated Jul. 8, 2024, 13 pages.

* cited by examiner

*Primary Examiner* — Catherine T. Rastovski
*Assistant Examiner* — Nyla Gavia
(74) *Attorney, Agent, or Firm* — Eversheds Sutherland (US) LLP

(57) ABSTRACT

The present application provides a method for determining a distance to a fault in a power systems network. The method may involve determining, based on a set of measured voltage samples, a set of processed voltage samples; determining, based on a set of measured current samples, a set of processed reactive current samples, a set of processed resistive current samples, a set of processed negative sequence current samples, and a set of processed zero sequence current samples; selecting, based on an indication from a faulty phase indicator, a selected processed voltage sample, a selected processed reactive current sample, a selected processed resistive current sample, and a selected processed negative or zero sequence current sample; determining, based on the selected processed reactive current sample, that no distortion has occurred due to current transformer (CT) saturation; and calculating, based on the determination that no distortion has occurred, the distance to the fault.

20 Claims, 6 Drawing Sheets

SYSTEMS AND METHODS FOR DETERMINING A DISTANCE TO A FAULT IN A POWER SYSTEMS NETWORK

TECHNICAL FIELD

The present application and the resultant patent relate generally to power systems networks and more particularly relate to systems and methods for determining a distance to a fault in power systems networks.

BACKGROUND

Generally described, fault location in cables and/or overhead lines systems using phasor-based single-ended fault locator algorithms is inaccurate during current transformer (CT) saturation conditions. Accordingly, there is a growing need for a method to accurately calculate a distance to a fault in certain types of systems based on single-ended measurement samples that are immune to CT saturation.

This may not only reduce the requirements of existing CTs, but may also reduce the error rate of fault location using the single-ended measurements to less than 2% for both single-line-to-ground (SLG) faults and phase-to-phase (-to-ground) faults having a resistance of 20 Ohms and a Source Impedance Ratio (SIR) of 10. Additionally, fault location may remain accurate even during severe CT saturation that reaches up to $\frac{1}{4}$ cycle of the saturation start time and $\frac{1}{2}$ cycle of the saturation maximum duration in each fundamental frequency cycle.

SUMMARY

The present application and the resultant patent thus provide a method for determining a distance to a fault in a power systems network. The method may include the steps of: determining, based at least in part on a set of measured voltage samples, a set of processed voltage samples; determining, based at least in part on a set of measured current samples, a set of processed reactive current samples and a set of processed resistive current samples; determining, based at least in part on the set of measured current samples, a set of processed negative sequence current samples and a set of processed zero sequence current samples; selecting, based at least in part on an indication from a faulty phase indicator, a selected processed voltage sample of the set of processed voltage samples, a selected processed reactive current sample of the set of processed reactive current samples, a selected processed resistive current sample of the set of processed resistive current samples, and a selected processed negative or zero sequence current sample of the set of processed negative sequence current or the set of processed zero sequence current samples; determining, based at least in part on the selected processed reactive current sample, that no distortion has occurred on the set of measured voltage samples and the set of measured current samples due to current transformer (CT) saturation; and calculating, based at least in part on the determination that no distortion has occurred, the selected processed voltage sample, the selected processed reactive current sample, the selected processed resistive current sample, and the selected processed negative or zero sequence current sample, the distance to the fault.

The present application and the resultant patent further provide a method for determining a distance to a fault in a power systems network. The method may include the steps of: receiving a set of measured voltage samples and a set of measured current samples; determining, based at least in part on the set of measured voltage samples, a set of processed voltage samples; determining, based at least in part on the set of measured current samples, a set of processed reactive current samples and a set of processed resistive current samples; determining, based at least in part on the set of measured current samples, a set of processed negative sequence current samples and a set of processed zero sequence current samples; receiving an indication from a faulty phase indicator; selecting, based at least in part on the indication, a selected processed voltage sample of the set of processed voltage samples, a selected processed reactive current sample of the set of processed reactive current samples, a selected processed resistive current sample of the set of processed resistive current samples, and a selected processed negative or zero sequence current sample of the set of processed negative sequence current samples or the set of processed zero sequence current samples; determining, based at least in part on the selected processed reactive current samples, that no distortion has occurred on the set of measured voltage samples and the set of measured current samples due to current transformer (CT) saturation; and calculating, based at least in part on the determination that no distortion has occurred, the selected processed voltage sample, the selected processed reactive current sample, the selected processed resistive current sample, and the selected processed negative or zero sequence current sample, the distance to the fault.

The present application and the resultant patent further provide a power systems network. The power systems network may include: a power line, wherein a set of measured voltage samples and a set of measured current samples is associated with a section of the power line; and a fault located on the power line, wherein a set of processed voltage samples are determined based at least in part on the set of measured voltage samples, wherein a set of processed reactive current samples, a set of processed resistive current samples, a set of processed negative sequence current samples, and a set of processed zero sequence current samples are determined based at least in part on the set of measured current samples, wherein a selected processed voltage sample of the set of processed voltage samples, a selected processed reactive current sample of the set of processed reactive current samples, a selected processed resistive current sample of the set of processed resistive current samples, and a selected processed negative or zero sequence current sample of the set of processed negative sequence current samples or the set of processed zero sequence current samples are selected based at least in part on an indication from a faulty phase indicator, wherein a determination that no distortion has occurred on the set of measured voltage samples and the set of measured current samples due to current transformer (CT) saturation is made based at least in part on the selected processed reactive current sample, and wherein a distance to the fault is calculated based at least in part on the determination that no distortion has occurred, the selected processed voltage sample, the selected processed reactive current sample, the selected processed resistive current sample, and the selected processed negative or zero sequence current sample.

These and other features and improvements of this application and the resultant patent will become apparent to one of ordinary skill in the art upon review of the following detailed description when taken in conjunction with the several drawings and the appended claims.

DETAILED DESCRIPTION

Figure 1:
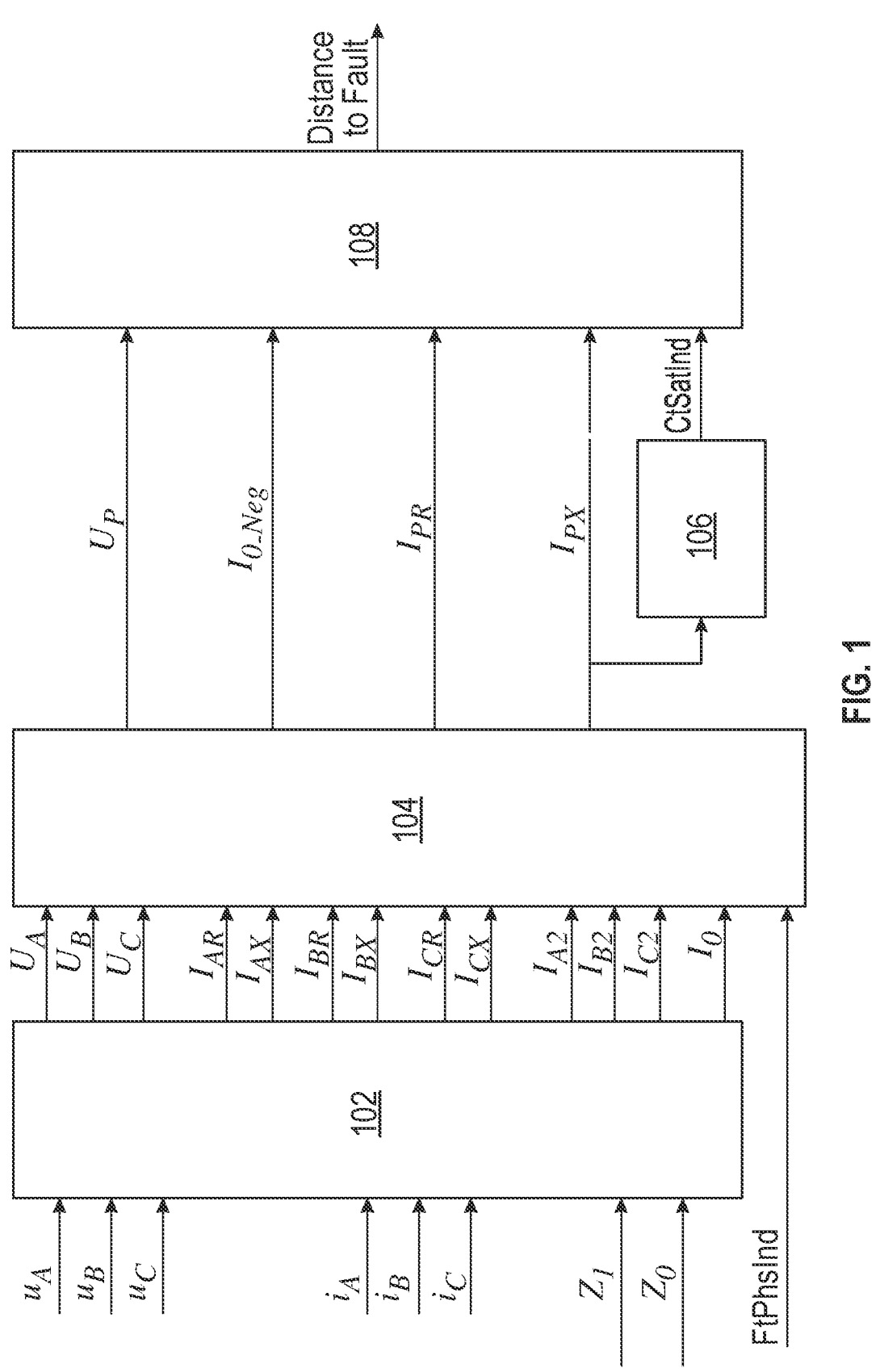
FIG. 1 is a schematic diagram of an algorithm for calculating a distance to a fault, in accordance with one or more example embodiments of the disclosure.

Referring now to the drawings, in which like numerals refer to like elements throughout the several views, FIG. 1 is a schematic diagram 100 of an algorithm for calculating a distance to a fault. The schematic diagram 100 may be applicable to fault distance calculations in power systems networks. At block 102, voltage samples and current samples may be prepared and processed to remove any decaying direct current (DC) components in order to formulate equations for calculating the distance to the fault. This process may be further depicted in FIG. 3. At block 104, relevant faulty phase processed voltage and current samples may be selected to formulate the equations for calculating the distance to the fault. The selection of the relevant faulty phase processed voltage and current samples from among the various processed voltage and current samples may be performed using a FtPhsInd input. This process may be further depicted in FIG. 4. At block 104, the algorithm may then output the relevant parameters of $U_P(n)$, $I_{0\_Neg}(n)$, $I_{PR}(n)$, and $I_{PX}(n)$.

At block 106, the $I_{PX}(n)$ output may be processed for a determination as to whether a voltage or current sample is distorted due to Current Transformer (CT) saturation. If the sample is not distorted due to CT saturation, block 106 may output a CT saturation indication digital signal CTSatInd=1. If the sample is distorted due to CT saturation, block 106 may output a CT saturation indication digital signal CTSatInd=0. This process may be further depicted in FIG. 5. At block 108, the distance to the fault may be calculated by formulation of the equations using the outputs of block 104 associated with the relevant faulty phase processed voltage and current samples if a digital signal indicating no CT saturation has been received from block 106. This process may be further depicted at FIG. 6.

Figure 2:
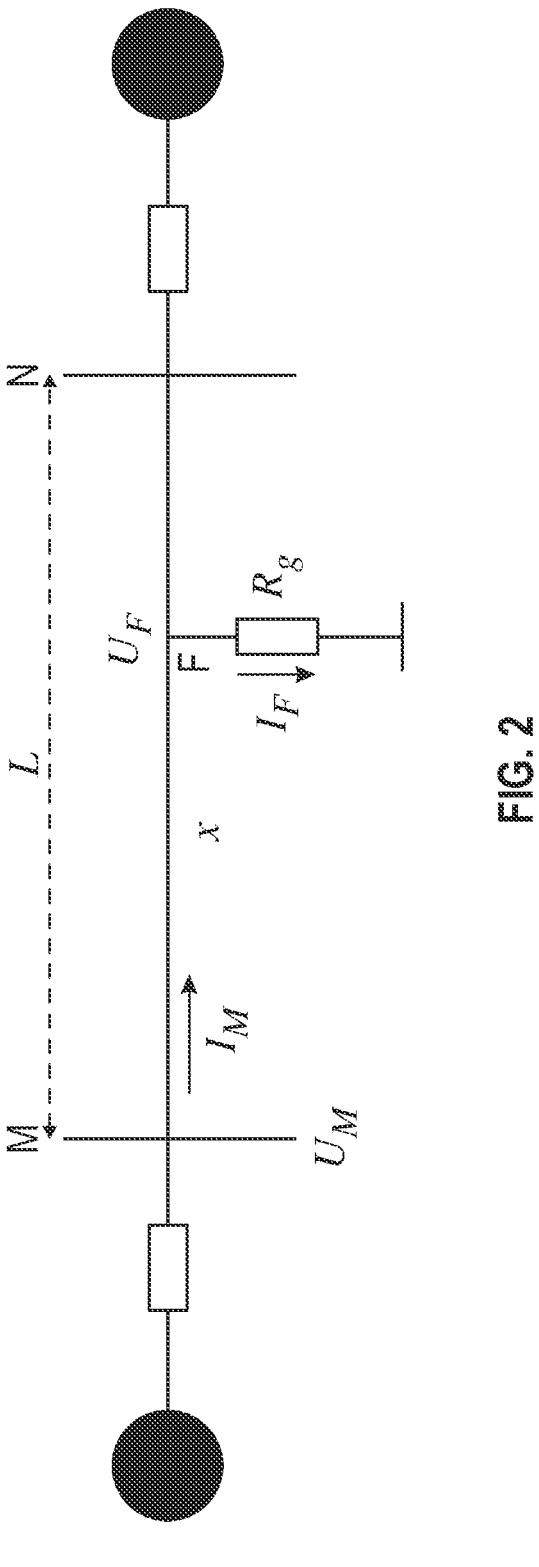
FIG. 2 is a schematic diagram of a power system network, in accordance with one or more example embodiments of the disclosure.

FIG. 2 is a schematic diagram 200 of a power system network. As depicted in FIG. 2, a power system network may have multiple power sources. Accordingly, a fault F may be located between points M and N in the power system network. A distance between points M and N may be noted as L. In FIG. 2, the distance to the fault F, as denoted by x, is the distance between M, where the fault locator is deployed, and F, where the fault has occurred. At point M, the applicable voltage and current may be denoted as $U_M$ and $I_M$, which are measured by the fault locator. Assuming the fault F has a fault resistance of $R_g$, the fault F may further be characterized with a voltage $U_F$ and a current $I_F$.

Thus, the time domain phase equations with respect to x may be as follows:

$$u_{M1}(t) = u_{F1}(t) + R_1 x i_{M1}(t) + L_1 x \frac{di_{M1}(t)}{dt} \text{(for positive sequences)}$$

$$u_{M2}(t) = u_{F2}(t) + R_2 x i_{M2}(t) + L_2 x \frac{di_{M2}(t)}{dt} \text{(for negative sequences)}$$

$$u_{M0}(t) = u_{F0}(t) + R_0 x i_{M0}(t) + L_0 x \frac{di_{M0}(t)}{dt} \text{(for zero sequences)}$$

In the case of a single-phase-to-ground fault, the following time domain phase equation may apply:

$$u_{Mp}(t) = u_{Fp}(t) + R_1 x[i_{Mp}(t) + K_R 3 i_{M0}(t)] + L_1 x \frac{d[i_{Mp}(t) + K_X 3 i_{M0}(t)]}{dt}$$

$$= K_g i_{M0}(t) + \left[ R_1 i_{MRp}(t) + L_1 \frac{di_{MXp}}{dt} \right] x$$

$$u_{Mp}(t) = u_{Fp}(t) + R_1 x[i_{Mp}(t) + K_R 3 i_{M0}(t)] + L_1 x \frac{d[i_{Mp}(t) + K_X 3 i_{M0}(t)]}{dt}$$

$$= K_g i_{M0}(t) + \left[ R_1 i_{MRp}(t) + L_1 \frac{di_{MXp}}{dt} \right] x$$

In the case of a phase-to-phase fault, the following time domain phase equation may apply:

$$u_{Mpp}(t) = u_{Fpp}(t) + R_1 x i_{Mpp}(t) + L_1 x \frac{di_{Mpp}(t)}{dt} =$$

$$K_g \frac{di_{M2pp}(t)}{dt} + \left[ R_1 i_{MRpp}(t) + L_1 \frac{di_{MXpp}}{dt} \right] x$$

$$u_{Mpp}(t) = u_{Fpp}(t) + R_1 x i_{Mpp}(t) + L_1 x \frac{di_{Mpp}(t)}{dt} =$$

$$K_g \frac{di_{M2pp}(t)}{dt} + \left[ R_1 i_{MRpp}(t) + L_1 \frac{di_{MXpp}}{dt} \right] x$$

In the above equations, p=A, B, or C, pp=AB, BC, or CA, $$K_X = \frac{X_0 - X_1}{3 X_1}.$$

When the time domain phase equations with respect to x are sampled, the following equations may apply:

$$\frac{u_{Mp}(n) + u_{Mp}(n-1)}{2} = K_g \frac{i_{M0}(n) + i_{M0}(n-1)}{2} +$$

$$\left[ R_1 \frac{i_{MRp}(n) + i_{MRp}(n-1)}{2} + X_1 \frac{[i_{MXp}(n) - i_{MXp}(n-1)]N_{spc}}{2\pi} \right] x$$

$$\frac{u_{Mpp}(n) + u_{Mpp}(n-1)}{2} = K_g \frac{i_{M2}(n) - i_{M2}(n-1)]N_{spc}}{2\pi} +$$

$$\left[ R_1 \frac{i_{MRpp}(n) + i_{MRpp}(n-1)}{2} + X_1 \frac{[i_{MXpp}(n) - i_{MXpp}(n-1)]N_{spc}}{2\pi} \right] x$$

Figure 6:
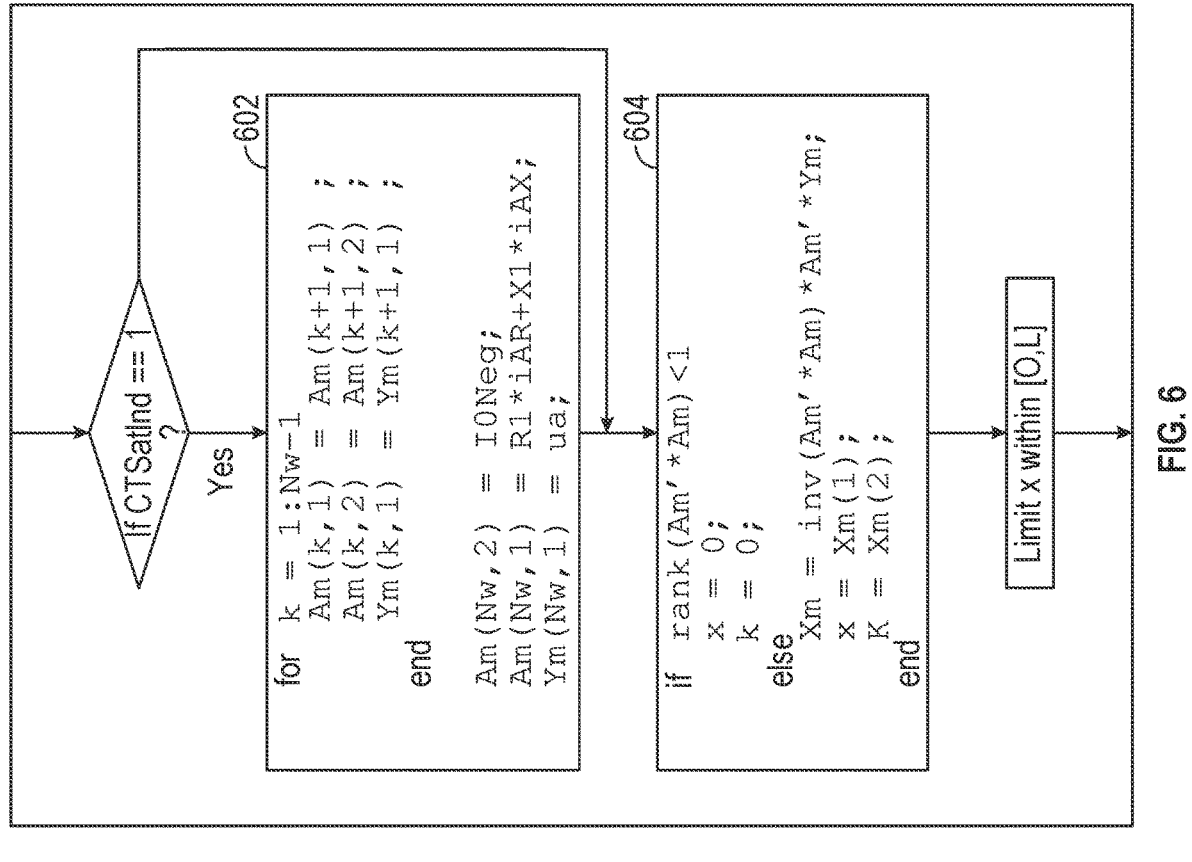
FIG. 6 is a flow chart depicting a calculation of a distance to a fault, in accordance with the algorithm of FIG. 1.

That is, $U_P(n)=K_g I_0(n)+[R_1 I_{MR}(n)+X_1 I_{MX}(n)]x$ and $U_{pp}(n)=K_g I_2(n)+[R_1 I_{MR}(n)+X_1 I_{MX}(n)]x$. These equations may be subsequently applied when calculating the distance to the fault. For example, the equations may be applied when generating matrix $Y_M$, as depicted in FIG. 6.

Figure 3:
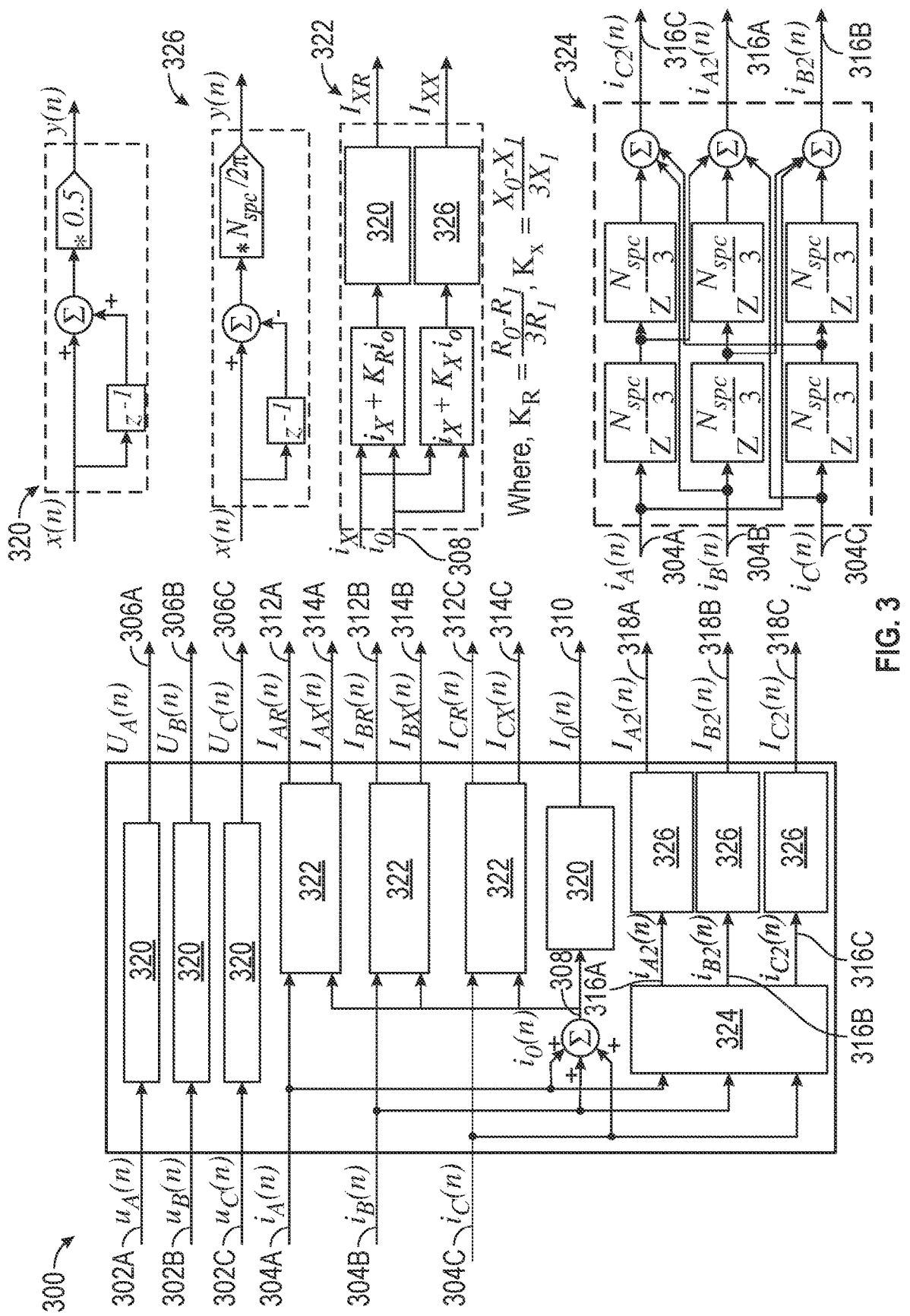
FIG. 3 is a schematic diagram of an algorithm for preparing voltage and current samples, in accordance with the algorithm of FIG. 1.

FIG. 3 is a schematic diagram 300 of an algorithm for preparing voltage and current samples, in accordance with the algorithm depicted in FIG. 1. The algorithm for preparing voltage and current samples may be applied at block 102 in FIG. 1. The algorithm may prepare the voltage and current samples by performing functions such as an averaging function 320, a resistive and reactive currents determination function 322, a negative sequence transducer function 324, and a differential function 326. At a local end, samples of each phase voltage and phase current may be measured. The samples may include three-phase voltage samples, such as $u_A(n)$ 302A, $u_B(n)$ 302B, and $u_C(n)$ 302C, and three-phase current samples, such as $i_A(n)$ 304A, $i_B(n)$ 304B, and $i_C(n)$ 304C. The three-phase voltage samples 302A-C and the three-phase current samples 304A-C may be inputs to the algorithm for preparing voltage and current samples. Although not depicted in FIG. 3, another set of inputs to the algorithm for preparing voltage and current samples may include positive-sequence impedances per unit length, $z_1$, and zero-sequence impedances per unit length, $z_0$, where $z_1=R_1+jX_1$ and $z_0=R_0+jX_0$, as depicted in FIG. 1.

The averaging function 320 calculates the average of two samples. For example, if the averaging function 320 receives an input of $x(n)$, the averaging function 320 may then calculate the sum of $x(n)$ and $x(n-1)$ and multiply the sum by 0.5. Thus, the output $y(n)$ of the averaging function 320 may be calculated as follows:

$$y(n) = \frac{x(n) + x(n-1)}{2}$$

The output $y(n)$ of the averaging function 320 may therefore be determined based at least in part on the application of a $z^{-1}$ function to the input $x(n)$.

Thus, the processed three-phase voltage samples, $U_A(n)$ 306A, $U_B(n)$ 306B, and $U_C(n)$ 306C, may be determined by applying the averaging function 320 to the three-phase voltage samples $u_A(n)$ 302A, $u_B(n)$ 302B, and $u_C(n)$ 302C. That is, the following equations may apply:

$$U_A(n) = \frac{u_A(n) + u_A(n-1)}{2}$$

$$U_B(n) = \frac{u_B(n) + u_B(n-1)}{2}$$

$$U_C(n) = \frac{u_C(n) + u_C(n-1)}{2}$$

The resistive and reactive currents determination function 322 calculates resistive and reactive currents based on a phase current sample $i_x(n)$ (for example, $i_A(n)$ 304A, $i_B(n)$ 304B, and $i_C(n)$ 304C) and a total current sample $i_0(n)$ 308, where the total current sample $i_0(n)$ 308 is the sum of $i_A(n)$ 304A, $i_B(n)$ 304B, and $i_C(n)$ 304C. That is, $i_0(n)=i_A(n)+i_B(n)+i_C(n)$. A processed current sample $I_0(n)$ 310 may be determined by applying the averaging function 320 to the total current sample $i_0(n)$ 308. That is, the following equation may apply:

$$I_0(n) = \frac{i_0(n) + i_0(n-1)}{2}$$

If the resistive and reactive currents determination function 322 receives an input of $i_x(n)$ and $i_0(n)$ 308, a resistive part of the current $$i_{xRes}(n) = i_x(n) + K_R \, i_0(n)$$

may be measured, where $K_R$ is the coefficient for compensating the resistive current with a zero sequence current, and where $$K_R = \frac{R_0 - R_1}{3R_1},$$

where $R_n$ represents a resistance of the line. That is, $$i_{ARes}(n) = i_A(n) + K_R i_0(n)$$

$$i_{BRes}(n) = i_B(n) + K_R i_0(n)$$

$$i_{CRes}(n) = i_C(n) + K_R i_0(n)$$

Subsequently, the averaging function 320 may be applied to the resistive part of the current in order to determine processed resistive currents $I_{xR}(n)$. That is, $$I_{xR}(n) = \frac{i_{xRes}(n) + i_{xRes}(n-1)}{2}$$

Thus, the processed resistive currents $I_{AR}(n)$ 312A, $I_{BR}(n)$ 312B, and $I_{CR}(n)$ 312C may be determined as follows:

$$I_{AR}(n) = \frac{i_{ARes}(n) + i_{ARes}(n-1)}{2}$$

$$I_{BR}(n) = \frac{i_{BRes}(n) + i_{BRes}(n-1)}{2}$$

$$I_{CR}(n) = \frac{i_{CRes}(n) + i_{CRes}(n-1)}{2}$$

If the resistive and reactive currents determination function 322 receives an input of $i_x(n)$ and $i_0(n)$ 308, a reactive part of the current $$i_{xReact}(n) = i_x(n) + K_X i_0(n)$$

may be measured, where $K_X$ is the coefficient for compensating the reactive current with a zero sequence current, and where $$K_X = \frac{X_0 - X_1}{3X_1},$$

wherein $X_n$ represents a reactance of a line. That is, $$i_{AReact}(n) = i_A(n) + K_X i_0(n)$$

$$i_{BReact}(n) = i_B(n) + K_X i_0(n)$$

$$i_{CReact}(n) = i_C(n) + K_X i_0(n)$$

Subsequently, a differential function 326 may be applied to the reactive part of the current in order to determine processed resistive currents $I_{xX}(n)$.

The differential function 326 calculates the differential of two samples. For example, if the differential function 326 receives an input of x(n), the differential function 326 may then calculate the difference of x(n) and x(n−1) and multiple the difference by $$\frac{N_{spc}}{2\pi}.$$

Thus, the output y(n) of the differential function 326 may be calculated as follows:

$$y(n) = (x(n) - x(n-1)) * \frac{N_{spc}}{2\pi}$$

where $N_{spc}$ is the number of samples per cycle. The output y(n) of the differential function 326 may therefore be determined based at least in part on the application of a $z^{-1}$ function to the input x(n).

Thus, when applying the differential function 326 to the reactive part of the current, the processed reactive currents $I_{xX}(n)$. That is, $$I_{xX}(n) = \frac{i_{xReact}(n) - i_{xReact}(n-1)}{2\pi} N_{spc}$$

Thus, the processed reactive currents $I_{AX}(n)$ 314A, $I_{BX}(n)$ 314B, and $I_{CX}(n)$ 314C may be determined as follows:

$$I_{AX}(n) = \frac{i_{AReact}(n) - i_{AReact}(n-1)}{2\pi} * N_{spc}$$

$$I_{BX}(n) = \frac{i_{BReact}(n) - i_{BReact}(n-1)}{2\pi} * N_{spc}$$

$$I_{CX}(n) = \frac{i_{CReact}(n) - i_{CReact}(n-1)}{2\pi} * N_{spc}$$

$N_{spc}$ represents the number of samples per cycle. For example, if $N_{spc}=64$ samples per cycle of 50 Hz, the sampling frequency would be 64 samples divided by 0.02 to obtain a 3.2 kHz sampling frequency.

The negative sequence transducer function 324 calculates negative current samples based on the phase current samples (for example, $i_A(n)$ 304A, $i_B(n)$ 304B, and $i_C(n)$ 304C). The output $i_{x2}(n)$ of the negative sequence transducer function 324 may therefore be determined based at least in part on the application of a $z^{-Nspc/3}$ function to the inputs, which are the phase current samples. The negative sequence transducer function 324 is thus configured to output negative current samples $i_{A2}(n)$ 316A, $i_{B2}(n)$ 316B, and $i_{C2}(n)$ 316C using the following equations:

$$i_{A2}(n) = i_A\left(n - \frac{N_{spc}}{3}\right) + i_B\left(n - \frac{2N_{spc}}{3}\right) + i_C(n)$$

$$i_{B2}(n) = i_B\left(n - \frac{N_{spc}}{3}\right) + i_C\left(n - \frac{2N_{spc}}{3}\right) + i_A(n)$$

-continued $$i_{C2}(n) = i_C\left(n - \frac{N_{spc}}{3}\right) + i_A\left(n - \frac{2N_{spc}}{3}\right) + i_B(n)$$

A processed negative current sample $I_{A2}(n)$ 318A may then be determined by applying the differential function 326 to the negative current sample $i_{A2}(n)$ 316A. That is, $$I_{A2}(n) = \frac{i_{A2}(n) + i_{A2}(n-1)}{2\pi} * N_{spc}$$

A processed negative current sample $I_{B2}(n)$ 318B may be determined by applying the differential function 326 to the negative current sample $i_{B2}(n)$ 316B. That is, $$I_{B2}(n) = \frac{i_{B2}(n) - i_{B2}(n-1)}{2\pi} * N_{spc}$$

A processed negative current sample $I_{C2}(n)$ 318C may be determined by applying the differential function 326 to the negative current sample $i_{C2}(n)$ 316C. That is, $$I_{C2}(n) = \frac{i_{C2}(n) - i_{C2}(n-1)}{2\pi} * N_{spc}$$

Figure 4:
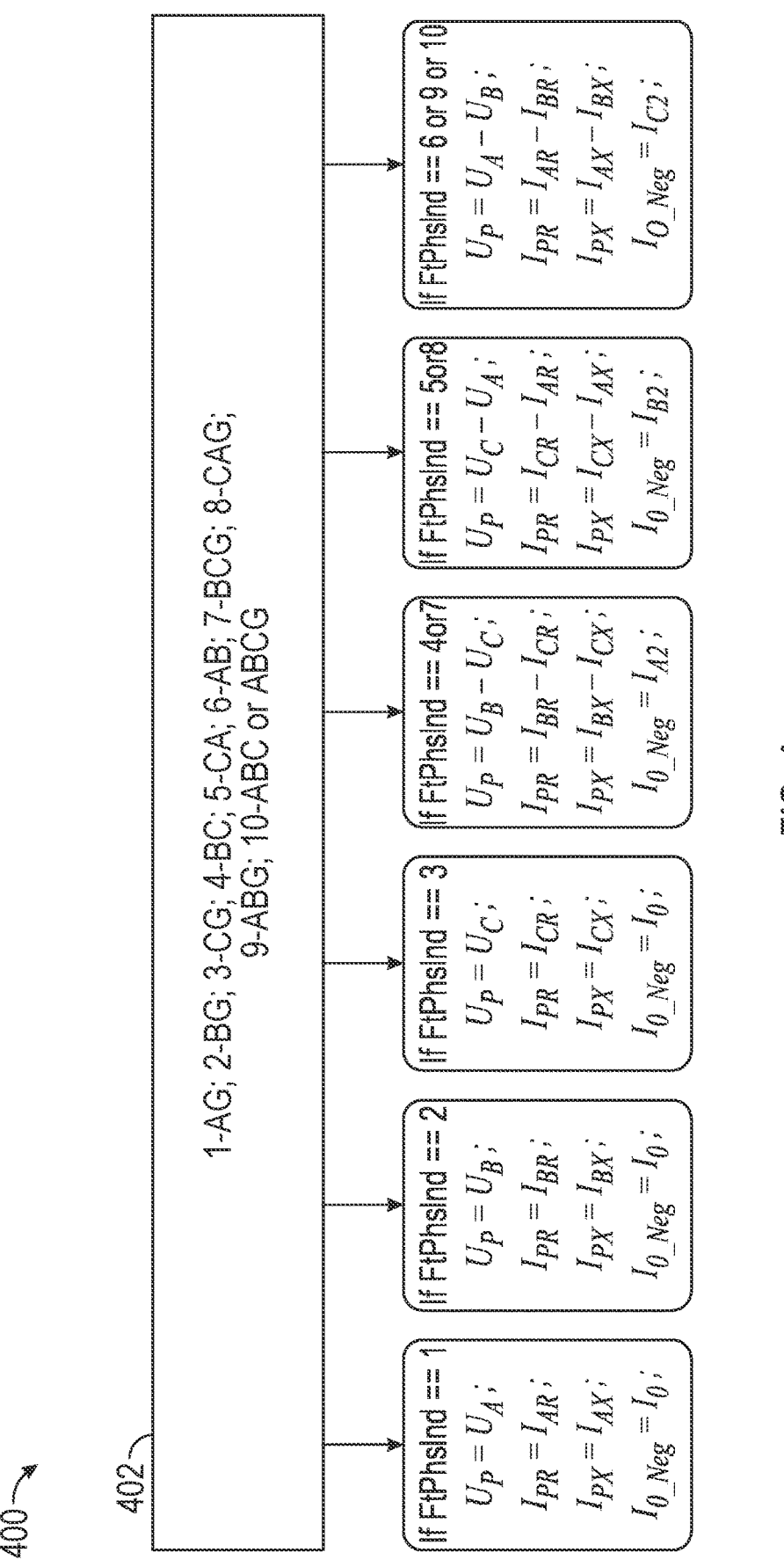
FIG. 4 is a schematic diagram of an algorithm for selecting faulted phase voltage and current samples, in accordance with the algorithm of FIG. 1.

FIG. 4 is a schematic diagram 400 of an algorithm for selecting faulted phase voltage and current samples. In order to select the faulted phase voltage and current samples, the type of fault may be indicated. A faulty phase indicator 402 may indicate a number from 1 to 10 in order to indicate the type of fault present in a power systems network. For example, the faulty phase indicator may indicate 1 for a phase-A-to-ground fault, 2 for a phase-B-to-ground fault, 3 for a phase-C-to-ground fault, 4 for a phase-B-to-C fault, 5 for a phase-C-to-A fault, 6 for a phase A-to-B fault, 7 for a phase-B-to-C-to-ground fault, 8 for a phase-C-to-A-to-ground fault, 9 for a phase-A-to-B-to-ground fault, and 10 for a phase-A-to-B-to-C fault or a phase-A-to-B-to-C-to-ground fault.

If the faulty phase indicator 402 indicates a 1, then $U_P(n)=U_A(n)$, $I_{PR}(n)=I_{AR}(n)$, $I_{PX}(n)=I_{AX}(n)$, and $I_{0\_Neg}(n)=I_0(n)$. If the faulty phase indicator 402 indicates a 2, then $U_P(n)=U_B(n)$, $I_{PR}(n)=I_{BR}(n)$, $I_{PX}(n)=I_{BX}(n)$, and $I_{0\_Neg}(n)=I_0(n)$. If the faulty phase indicator 402 indicates a 3, then $U_P(n)=U_C(n)$, $I_{PR}(n)=I_{CR}(n)$, $I_{PX}(n)=I_{CX}(n)$, and $I_{0\_Neg}(n)=I_0(n)$. If the faulty phase indicator 402 indicates a 4 or a 7, then $U_P(n)=U_B(n)-U_C(n)$, $I_{PR}(n)=I_{BR}(n)-I_{CR}(n)$, $I_{PX}(n)=I_{BX}(n)-I_{CX}(n)$, and $I_{0\_Neg}(n)=I_{A2}(n)$. If the faulty phase indicator 402 indicates a 5 or 8, then $U_P(n)=U_C(n)-U_A(n)$, $I_{PR}(n)=I_{CR}(n)-I_{AR}(n)$, $I_{PX}(n)=I_{CX}(n)-I_{AX}(n)$, and $I_{0\_Neg}(n)=I_{B2}(n)$. If the faulty phase indicator 402 indicates a 6, 9, or 10, then $U_P(n)=U_A(n)-U_B(n)$, $I_{PR}(n)=I_{AR}(n)-I_{BR}(n)$, $I_{PX}(n)=I_{AX}(n)-I_{BX}(n)$, and $I_{0\_Neg}(n)=I_{C2}(n)$.

Figure 5:
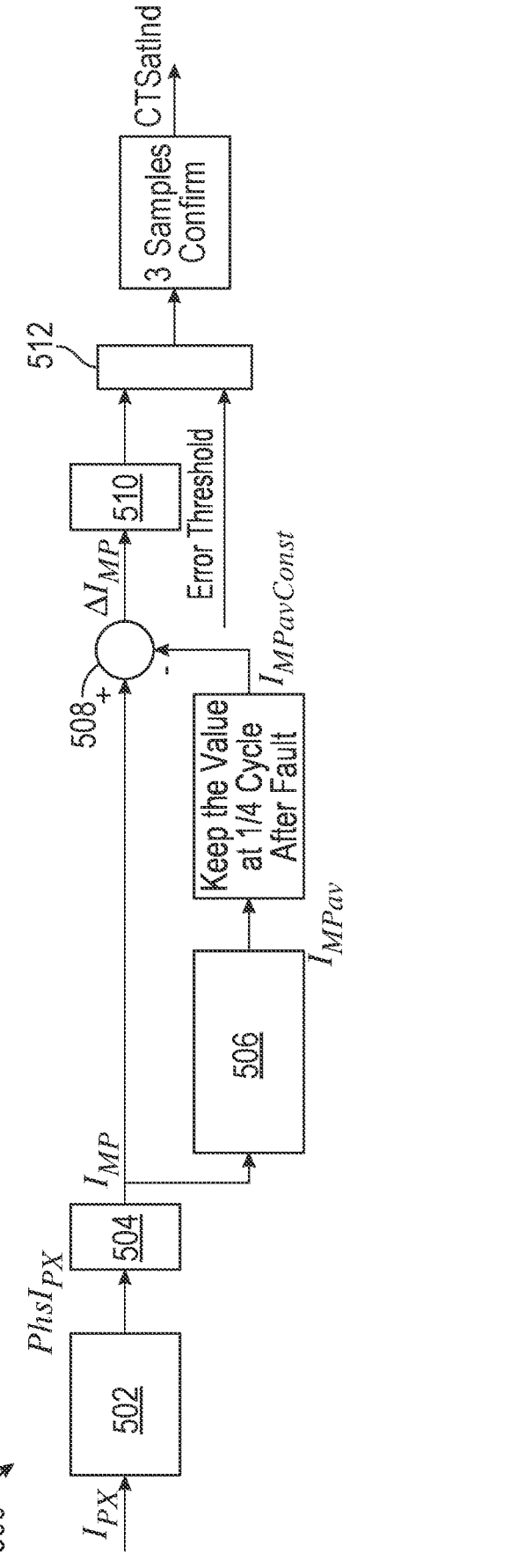
FIG. 5 is a schematic diagram of an algorithm for detecting CT saturation, in accordance with the algorithm of FIG. 1.

FIG. 5 depicts a schematic diagram 500 of an algorithm for indicating if the present sample is distorted due to CT saturation. The algorithm for detecting CT saturation may receive $I_{PX}(n)$, which is an output of a faulty phase indicator, for example, the faulty phase indicator 402 of FIG. 4, as an input. $I_{PX}(n)$ may represent a processed reactive current. The input $I_{PX}(n)$ may be input into a short-window algorithm for calculating full-cycle Fourier phasor 502. That is, the short-window algorithm for calculating full-cycle Fourier phasor 502 may be a ¼ cycle Fourier phasor. The short-window algorithm for calculating full-cycle Fourier phasor 502 may then output $PhsI_{PX}(n)$ by convoluting the input $I_{PX}(n)$ with a set of complex coefficients $h(k)$. The convolution may be performed by applying the following equation:

$$PhsI_{PX}(n) = \sum_{k=1}^{M} I_{PX}(n - k + 1)h(k)$$

where M is a window length corresponding to ¼ of the length of the cycle (for example, if the number of samples per cycle is 64, then M would equal ¼ of 64, which is 16), where $h(k)$, $k=1, 2, \ldots, M$, is obtained by using the second row of Matrix H.

Matrix H may be calculated by $H=(A^T A)^{-1} A^H$, where $$A = \begin{bmatrix} z_{NP}^M & \frac{z_0^M}{2} & \frac{z_1^M}{2} \\ \cdots & \cdots & \cdots \\ z_{NP} & \frac{z_0}{2} & \frac{z_1}{2} \\ 1 & 1 & 1 \end{bmatrix}$$

and where $$z_{NP} = e^{-\frac{T_s}{T_a}}, z_0 = e^{j\frac{2\pi}{N_{spc}}}, \text{ and } z_1 = e^{-j\frac{2\pi}{N_{spc}}}.$$

As noted above, $N_{spc}$ represents the number of samples per cycle. $T_s$ represents the sampling period, and $T_a$ represents the decaying period of the decaying DC component. If $N_{spc}$ is 64 samples per cycle of 50 Hz, then the sampling period $$T_s = \frac{\frac{1}{50}}{64}.$$

The decaying period of the decaying DC component $$T_a = \frac{X_1}{100\pi R_1},$$

where $X_1$ and $R_1$ were previously used to calculate coefficients $K_R$ and $K_X$.

After $PhsI_{PX}(n)$ has been calculated, the magnitude of $PhsI_{PX}(n)$ may be determined. The magnitude of $PhsI_{PX}(n)$ may reflect the absolute value of $PhsI_{PX}(n)$. An absolute function 504 may be applied to $PhsI_{PX}(n)$, where the absolute value of $PhsI_{PX}(n)$, $I_{MP}$, is calculated as follows:

$$I_{MP}(n) = abs(PhsI_{PX}(n)) = \sqrt{[real(PhsI_{PX}(n))]^2 + [imag(PhsI_{PX}(n))]^2}$$

After $I_{MP}(n)$ has been calculated, an averaging component 506 may be applied to calculate the average of the $I_{MP}(n)$, $I_{MPav}(n)$, in an eighth of a cycle. This may be done by applying the following equation:

$$I_{MPav}(n) = \sqrt{\sum_{k=1}^{\frac{N_{spc}}{8}} [I_{MP}(n - k + 1)]^2}$$

After the average value $I_{MPav}(n)$ has been calculated, it may be kept within ¼ of the cycle time after the fault (that is, the half-cycle of the post-fault signature). Accordingly, $I_{MPavconst}(n)$, the constant of the average value $I_{MPav}(n)$ before CT saturation (that is, before the average value $I_{MPav}(n)$ is kept at ¼ of the cycle time) may be determined.

A difference component 508 may then receive $I_{MP}(n)$ and $I_{MPavconst}(n)$ as inputs and determine the difference between $I_{MP}(n)$ and $I_{MPavconst}(n)$. That is, $$\Delta I_{MP}(n) = I_{MP}(n) - I_{MPavConst}(n)$$

The difference may then be input into an absolute difference component 510 in order to determine the absolute value. That is, $$|\Delta I_{MP}(n)| = abs(\Delta I_{MP}(n)) = \sqrt{[real(\Delta I_{MP}(n))]^2 + [imag(\Delta I_{MP}(n))]^2}$$

The absolute value $|\Delta I_{MP}(n)|$ may then be input into a threshold function 512. The threshold function 512 may further receive as an input a predetermined error threshold value. For example, the predetermined error threshold value may be set as 1. If the absolute value $|\Delta I_{MP}(n)|$ is less than the predetermined error threshold value, then the sample is qualified, and the algorithm may output CTSatInd=1. This indicates that the sample is not presently being distorted by CT saturation. If the absolute value $|\Delta I_{MP}(n)|$ is not less than the predetermined error threshold value, then the sample is unqualified, and the algorithm may output CTSatInd=0. This indicates that the sample is presently being distorted by CT saturation.

In some instances, the algorithm may only output CTSatInd if it has received multiple inputs of $I_{PX}(n)$ and determined that three values of $|\Delta I_{MP}(n)|$ are either less than the predetermined error threshold value or not less than the predetermined threshold value.

FIG. 6 is a flow chart 600 depicting a calculation of a distance to a fault. If a sample has been shown to be qualified through an algorithm output of CTSatInd=1, then voltage and current parameters and other parameters corresponding to the sample may be used to generate a matrix for calculating the distance to the fault. For example, if $I_{PX}(n)$ is the sample that resulted in an algorithm output of CTSatInd=1, then the corresponding parameters may include $U_P(n)$, $I_{PR}(n)$, and $I_{PX}(n)$. In order to calculate the distance to the fault, matrices $Y_M$ and $A_M$ may first be formulated. The matrices may be formulated as follows:

$$Y_M = \begin{bmatrix} U_P(n) \\ U_P(n-1) \\ \dots \\ U_P(n-W) \end{bmatrix}, \text{ and } A_M = \begin{bmatrix} [R_1 I_{PR}(n) + X_1 I_{PX}(n)] & I_{0Neg}(n) \\ [R_1 I_{PR}(n-1) + X_1 I_{PX}(n-1)] & I_{0Neg}(n-1) \\ \dots & \dots \\ [R_1 I_{PR}(n-W) + X_1 I_{PX}(n-W)] & I_{0Neg}(n-W) \end{bmatrix}.$$

Notably, if the fault is detected to be a single-phase-to-ground fault, $I_{0Neg}$ (n) $I_0$ (n) at the fault, but $I_{0Neg}$ (n) $I_{Neg}$(n) for all remaining faults. $X_1$ and $R_1$ were previously used to calculate coefficients $K_R$ and $K_X$. The generation of the matrices $Y_M$ and $A_M$ are depicted in block 602.

The distance to the fault may then be calculated by solving the following matrix equation:

$$Y_M = A_M \cdot X$$

$$\text{where } X = \begin{bmatrix} x \\ K \end{bmatrix}.$$

By using the Least Square Method on the two matrices, X may be determined by $$X = (A^T A)^{-1} A^T Y$$

The generation of the matrix X is depicted in block 604. The first element of the matrix X may then be the distance to the fault.

Once the distance to the fault has been determined, a control action may be performed based on the determination of the distance to the fault. For example, the control action may involve the generation of an alert to an operator.

It should be apparent that the foregoing relates only to certain embodiments of this application and resultant patent. Numerous changes and modifications may be made herein by one of ordinary skill in the art without departing from the general spirit and scope of the invention as defined by the following claims and the equivalents thereof.

Further aspects of the invention are provided by the subject matter of the following clauses:

1. A method for determining a distance to a fault in a power systems network, comprising: determining, based at least in part on a set of measured voltage samples, a set of processed voltage samples; determining, based at least in part on a set of measured current samples, a set of processed reactive current samples and a set of processed resistive current samples; determining, based at least in part on the set of measured current samples, a set of processed negative sequence current samples, and a set of processed zero sequence current samples; selecting, based at least in part on an indication from a faulty phase indicator, a selected processed voltage sample of the set of processed voltage samples, a selected processed reactive current sample of the set of processed reactive current samples, a selected processed resistive current sample of the set of processed resistive current samples, and a selected processed negative or zero sequence current sample of the set of processed negative sequence current samples or the set of processed zero sequence current samples; determining, based at least in part on the selected processed reactive current sample, that no distortion has occurred on the set of measured voltage samples and the set of measured current samples due to current transformer (CT) saturation; and calculating, based at least in part on the determination that no distortion has occurred, the selected processed voltage sample, the selected processed reactive current sample, the selected processed resistive current sample, and the selected processed negative or zero sequence current sample, the distance to the fault.

2. The method of clause 1, wherein calculating the distance to the fault based at least in part on the determination that no distortion has occurred further comprises: formulating a set of equations for calculating the distance to the fault, wherein the set of equations is based at least in part on the set of measured voltage samples and the set of measured current samples; and calculating, based at least in part on the set of equations, the determination that no distortion has occurred, the selected processed voltage sample, the selected processed reactive current sample, the selected processed resistive current sample, and the selected processed negative or zero sequence current sample, the distance to the fault.

3. The method of any preceding clause, wherein calculating the distance to the fault based at least in part on the determination that no distortion has occurred further comprises: formulating a first matrix based at least in part on the selected processed voltage sample; formulating a second matrix based at least in part on the selected processed reactive current sample, the selected processed resistive current sample, and the selected processed negative or zero sequence current sample; and calculating, based at least in part on the first matrix and the second matrix, the distance to the fault.

4. The method of any preceding clause, wherein determining that no distortion has occurred due to current transformer (CT) saturation based at least in part on the selected processed reactive current sample further comprises: calculating, based at least in part on the selected processed reactive current sample, a full-cycle Fourier phasor current in a fraction of a full-cycle; calculating a magnitude of the full-cycle Fourier phasor current; calculating an average of the magnitude of the full-cycle Fourier phasor current for one-eighth of a cycle; and determining a difference between the average of the magnitude of the full-cycle Fourier phasor current for one-eighth of the cycle and a constant, wherein the constant is determined based at least in part on the magnitude of the full-cycle Fourier phasor current in the fraction of the full-cycle after an occurrence of the fault.

5. The method of any preceding clause, wherein determining that no distortion has occurred due to CT saturation based at least in part on the selected processed reactive current sample further comprises: determining that the difference is less than a predetermined error threshold; responsive to the determination that the difference is less than the predetermined error threshold, determining that no distortion has occurred due to the CT saturation; and outputting an output of "1" based on the determination that no distortion has occurred on the set of measured voltage samples and the set of measured current samples due to the CT saturation 6. The method of any preceding clause, wherein determining the set of processed voltage samples based at least in part on the set of measured voltage samples further comprises: receiving the set of measured voltage samples; applying an averaging function to the set of measured voltage samples; and determining the set of processed voltage samples, wherein the set of processed voltage samples comprises an output of the averaging function.

7. The method of any preceding clause, wherein determining the set of processed reactive current samples and the set of processed resistive current samples based at least in part on the set of measured current samples further comprises: receiving the set of measured current samples; determining a set of processed resistive currents based at least in part on the set of measured current samples; applying an averaging function to the set of processed resistive currents; and determining the set of processed resistive current samples, wherein the set of processed resistive current samples comprises an output of the averaging function.

8. The method of any preceding clause, wherein determining the set of processed reactive current samples and the set of processed resistive current samples based at least in part on the set of measured current samples further comprises: receiving the set of measured current samples; determining a set of processed reactive currents based at least in part on the set of measured current samples; applying a differential function to the set of processed reactive currents; and determining the set of processed reactive current samples, wherein the set of processed reactive current samples comprises an output of the differential function.

9. The method of any preceding clause, wherein the indication from the faulty phase indicator is indicative of a type of fault associated with the fault.

10. A method for determining a distance to a fault in a power systems network, comprising: receiving a set of measured voltage samples and a set of measured current samples; determining, based at least in part on the set of measured voltage samples, a set of processed voltage samples; determining, based at least in part on the set of measured current samples, a set of processed reactive current samples and a set of processed resistive current samples; determining, based at least in part on the set of measured current samples, a set of processed negative sequence current samples and a set of processed zero sequence current samples; receiving an indication from a faulty phase indicator; selecting, based at least in part on the indication, a selected processed voltage sample of the set of processed voltage samples, a selected processed reactive current sample of the set of processed reactive current samples, a selected processed resistive current sample of the set of processed resistive current samples, and a selected processed negative or zero sequence current sample of the set of processed negative sequence current samples or the set of processed zero sequence current samples; determining, based at least in part on the selected processed reactive current sample, that no distortion has occurred on the set of measured voltage samples and the set of measured current samples due to current transformer (CT) saturation; and calculating, based at least in part on the determination that no distortion has occurred, the selected processed voltage sample, the selected processed reactive current sample, the selected processed resistive current sample, and the selected processed negative or zero sequence current sample, the distance to the fault.

11. The method of any preceding clause, wherein calculating the distance to the fault based at least in part on the set of equations, the determination that no distortion has occurred further comprises: formulating a set of equations for calculating the distance to the fault, wherein the set of equations is based at least in part on the set of measured voltage samples and the set of measured current samples; and calculating, based at least in part on the determination that no distortion has occurred, the selected processed voltage sample, the selected processed reactive current sample, the selected processed resistive current sample, and the selected processed negative or zero sequence current sample, the distance to the fault.

12. The method of any preceding clause, wherein calculating the distance to the fault based at least in part on the determination that no distortion has occurred further comprises: formulating a first matrix based at least in part on the selected processed voltage sample; formulating a second matrix based at least in part on the selected processed reactive current sample, the selected processed resistive current sample, and the selected processed negative or zero sequence current sample; and calculating, based at least in part on the first matrix and the second matrix, the distance to the fault.

13. The method of any preceding clause, wherein determining that no distortion has occurred due to current transformer (CT) saturation based at least in part on the selected processed reactive current sample further comprises: calculating, based at least in part on the selected processed reactive current sample, a full-cycle Fourier phasor current in a fraction of a full-cycle; calculating a magnitude of the full-cycle Fourier phasor current; calculating an average of the magnitude of the full-cycle Fourier phasor current for one-eighth of a cycle; and determining a difference between the average of the magnitude of the full-cycle Fourier phasor current for one-eighth of the cycle and a constant, wherein the constant is determined based at least in part on the magnitude of the full-cycle Fourier phasor current in the fraction of the full-cycle after an occurrence of the fault.

14. The method of any preceding clause, wherein determining that no distortion has occurred due to CT saturation based at least in part on the selected processed reactive current sample further comprises: determining that the difference is less than a predetermined error threshold; responsive to the determination that the difference is less than the predetermined error threshold, determining that no distortion has occurred due to the CT saturation; and outputting an output of "1" based on the determination that no distortion has occurred on the set of measured voltage samples and the set of measured current samples due to the CT saturation.

15. The method of any preceding clause, wherein determining the set of processed voltage samples based at least in part on the set of measured voltage samples further comprises: receiving the set of measured voltage samples; applying an averaging function to the set of measured voltage samples; and determining the set of processed voltage samples, wherein the set of processed voltage samples comprises an output of the averaging function.

16. The method of any preceding clause, wherein determining the set of processed reactive current samples and the set of processed resistive current samples based at least in part on the set of measured current samples further comprises: receiving the set of measured current samples; determining a set of processed resistive currents based at least in part on the set of measured current samples; applying an averaging function to the set of processed resistive currents; and determining the set of processed resistive current samples, wherein the set of processed resistive current samples comprises an output of the averaging function.

17. The method of any preceding clause, wherein determining the set of processed reactive current samples and the set of processed resistive current samples based at least in part on the set of measured current samples further comprises: receiving the set of measured current samples; determining a set of processed reactive currents based at least in part on the set of measured current samples; applying a differential function to the set of processed reactive currents; and determining the set of processed reactive current samples, wherein the set of processed reactive current samples comprises an output of the differential function.

18. A power systems network, comprising: a power line, wherein a set of measured voltage samples and a set of measured current samples is associated with a section of the power line; and a fault located on the power line, wherein a set of processed voltage samples are determined based at least in part on the set of measured voltage samples, wherein a set of processed reactive current samples, a set of processed resistive current samples, a set of processed negative sequence current samples, and a set of processed zero sequence current samples are determined based at least in part on the set of measured current samples, wherein a selected processed voltage sample of the set of processed voltage samples, a selected processed reactive current sample of the set of processed reactive current samples, a selected processed resistive current sample of the set of processed resistive current samples, and a selected processed negative or zero sequence current sample of the set of processed negative sequence current samples or the set of processed zero sequence current samples are selected based at least in part on an indication from a faulty phase indicator, wherein a determination that no distortion has occurred on the set of measured voltage samples and the set of measured current samples due to current transformer (CT) saturation is made based at least in part on the selected processed reactive current sample, and wherein a distance to the fault is calculated based at least in part on the determination that no distortion has occurred, the selected processed voltage sample, the selected processed reactive current sample, the selected processed resistive current sample, and the selected processed negative or zero sequence current sample.

19. The power systems network of any preceding clause, wherein the distance to the fault is calculated further based at least in part on a set of equations based at least in part on the set of measured voltage samples and the set of measured current samples, the selected processed voltage sample, the selected processed reactive current sample, the selected processed resistive current sample, and the selected processed negative or zero sequence current sample, the distance to the fault.

20. The power systems network of any preceding clause, wherein the determination that no distortion has occurred due to current transformer (CT) saturation based at least in part on the selected processed reactive current sample further comprises: calculating, based at least in part on the selected processed reactive current sample, a full-cycle Fourier phasor current in a fraction of a full-cycle; calculating a magnitude of the full-cycle Fourier phasor current; calculating an average of the magnitude of the full-cycle Fourier phasor current for one-eighth of a cycle; determining a difference between the average of the magnitude of the full-cycle Fourier phasor current for one-eighth of the cycle and a constant, wherein the constant is determined based at least in part on the magnitude of the full-cycle Fourier phasor current in the fraction of the full-cycle after an occurrence of the fault; determining that the difference is less than a predetermined error threshold; responsive to the determination that the difference is less than the predetermined error threshold, determining that no distortion has occurred due to the CT saturation; and outputting an output of "1" based on the determination that no distortion has occurred on the set of measured voltage samples and the set of measured current samples due to the CT saturation.

We claim:

1. A method for determining a distance to a fault in a power systems network, comprising:

collecting a set of measured voltage samples and a set of measured current samples over a first time window;

determining, based at least in part on the set of measured voltage samples, a set of processed voltage samples;

determining, based at least in part on the set of measured current samples, a set of processed reactive current samples and a set of processed resistive current samples;

determining, based at least in part on the set of measured current samples, a set of processed negative sequence current samples and a set of processed zero sequence current samples;

selecting, based at least in part on an indication from a faulty phase indicator, a selected processed voltage sample of the set of processed voltage samples, a selected processed reactive current sample of the set of processed reactive current samples, a selected processed resistive current sample of the set of processed resistive current samples, and a selected processed negative or zero sequence current sample of the set of processed negative sequence current samples or the set of processed zero sequence current samples;

determining, based at least in part on the selected processed reactive current sample, that no distortion has occurred during the first time window on the set of measured voltage samples and the set of measured current samples due to current transformer (CT) saturation;

detecting, based at least in part on a second set of measured voltage samples and a second set of measured current samples collected over a second time window, that CT saturation distortion is present during the second time window; and calculating, based at least in part on the determination that no distortion has occurred, the selected processed voltage sample, the selected processed reactive current sample, the selected processed resistive current sample, and the selected processed negative or zero sequence current sample, the distance to the fault, wherein the calculating of the distance to the fault excludes the use of voltage and current samples collected from time windows in which the CT saturation distortion was detected.

2. The method of claim 1, wherein calculating the distance to the fault based at least in part on the determination that no distortion has occurred further comprises:

formulating a set of equations for calculating the distance to the fault, wherein the set of equations is based at least in part on the set of measured voltage samples and the set of measured current samples; and calculating, based at least in part on the set of equations, the determination that no distortion has occurred, the selected processed voltage sample, the selected processed reactive current sample, the selected processed resistive current sample, and the selected processed negative or zero sequence current sample, the distance to the fault.

3. The method of claim 2, wherein calculating the distance to the fault based at least in part on the determination that no distortion has occurred further comprises:

formulating a first matrix based at least in part on the selected processed voltage sample;

formulating a second matrix based at least in part on the selected processed reactive current sample, the selected processed resistive current sample, and the selected processed negative or zero sequence current sample; and calculating, based at least in part on the first matrix and the second matrix, the distance to the fault.

4. The method of claim 1, wherein determining that no distortion has occurred due to current transformer (CT) saturation based at least in part on the selected processed reactive current sample further comprises:

calculating, based at least in part on the selected processed reactive current sample, a full-cycle Fourier phasor current in a fraction of a full-cycle;

calculating a magnitude of the full-cycle Fourier phasor current;

calculating an average of the magnitude of the full-cycle Fourier phasor current for one-eighth of a cycle; and determining a difference between the average of the magnitude of the full-cycle Fourier phasor current for one-eighth of the cycle and a constant, wherein the constant is determined based at least in part on the magnitude of the full-cycle Fourier phasor current in the fraction of the full-cycle after an occurrence of the fault.

5. The method of claim 4, wherein determining that no distortion has occurred due to CT saturation based at least in part on the selected processed reactive current sample further comprises:

determining that the difference is less than a predetermined error threshold;

responsive to the determination that the difference is less than the predetermined error threshold, determining that no distortion has occurred due to the CT saturation; and outputting an output of "1" based on the determination that no distortion has occurred on the set of measured voltage samples and the set of measured current samples due to the CT saturation.

6. The method of claim 1, wherein determining the set of processed voltage samples based at least in part on the set of measured voltage samples further comprises:

receiving the set of measured voltage samples;

applying an averaging function to the set of measured voltage samples; and determining the set of processed voltage samples, wherein the set of processed voltage samples comprises an output of the averaging function.

7. The method of claim 1, wherein determining the set of processed reactive current samples and the set of processed resistive current samples based at least in part on the set of measured current samples further comprises:

receiving the set of measured current samples;

determining a set of processed resistive currents based at least in part on the set of measured current samples;

applying an averaging function to the set of processed resistive currents; and determining the set of processed resistive current samples, wherein the set of processed resistive current samples comprises an output of the averaging function.

8. The method of claim 7, wherein determining the set of processed reactive current samples and the set of processed resistive current samples based at least in part on the set of measured current samples further comprises:

receiving the set of measured current samples;

determining a set of processed reactive currents based at least in part on the set of measured current samples;

applying a differential function to the set of processed reactive currents; and determining the set of processed reactive current samples, wherein the set of processed reactive current samples comprises an output of the differential function.

9. The method of claim 1, wherein the indication from the faulty phase indicator is indicative of a type of fault associated with the fault.

10. A method for determining a distance to a fault in a power systems network, comprising:

collecting a set of measured voltage samples and a set of measured current samples over a first time window;

determining, based at least in part on the set of measured voltage samples, a set of processed voltage samples;

determining, based at least in part on the set of measured current samples, a set of processed reactive current samples and a set of processed resistive current samples;

determining, based at least in part on the set of measured current samples, a set of processed negative current samples and a set of processed zero sequence current samples;

receiving an indication from a faulty phase indicator;

selecting, based at least in part on the indication, a selected processed voltage sample of the set of processed voltage samples, a selected processed reactive current sample of the set of processed reactive current samples, a selected processed resistive current sample of the set of processed resistive current samples, and a selected processed negative or zero sequence current sample of the set of processed negative sequence current samples or the set of processed zero sequence current samples;

determining, based at least in part on the selected processed reactive current sample, that no distortion has occurred during the first time window on the set of measured voltage samples and the set of measured current samples due to current transformer (CT) saturation;

determining, based at least in part on a second set of measured voltage samples and a second set of measured current samples collected over a second time window, that CT saturation distortion is present during the second time window; and calculating, based at least in part on the determination that no distortion has occurred, the selected processed voltage sample, the selected processed reactive current sample, the selected processed resistive current sample, and the selected processed negative or zero sequence current sample, the distance to the fault, wherein the calculating of the distance to the fault excludes the use of voltage and current samples collected from time windows in which the CT saturation distortion was detected.

11. The method of claim 10, wherein calculating the distance to the fault based at least in part on the determination that no distortion has occurred further comprises:

formulating a set of equations for calculating the distance to the fault, wherein the set of equations is based at least in part on the set of measured voltage samples and the set of measured current samples; and calculating, based at least in part on the set of equations, the determination that no distortion has occurred, the selected processed voltage sample, the selected processed reactive current sample, the selected processed resistive current sample, and the selected processed negative or zero sequence current sample, the distance to the fault.

12. The method of claim 11, wherein calculating the distance to the fault based at least in part on the determination that no distortion has occurred further comprises:

formulating a first matrix based at least in part on the selected processed voltage sample;

formulating a second matrix based at least in part on the selected processed reactive current sample, the selected processed resistive current sample, and the selected processed negative or zero sequence current sample; and calculating, based at least in part on the first matrix and the second matrix, the distance to the fault.

13. The method of claim 10, wherein determining that no distortion has occurred due to current transformer (CT) saturation based at least in part on the selected processed reactive current sample further comprises:

calculating, based at least in part on the selected processed reactive current sample, a full-cycle Fourier phasor current in a fraction of a full-cycle;

calculating a magnitude of the full-cycle Fourier phasor current;

calculating an average of the magnitude of the full-cycle Fourier phasor current for one-eighth of a cycle; and determining a difference between the average of the magnitude of the full-cycle Fourier phasor current for one-eighth of the cycle and a constant, wherein the constant is determined based at least in part on the magnitude of the full-cycle Fourier phasor current in the fraction of the full-cycle after an occurrence of the fault.

14. The method of claim 13, wherein determining that no distortion has occurred due to CT saturation based at least in part on the selected processed reactive current sample further comprises:

determining that the difference is less than a predetermined error threshold;

responsive to the determination that the difference is less than the predetermined error threshold, determining that no distortion has occurred due to the CT saturation; and outputting an output of "1" based on the determination that no distortion has occurred on the set of measured voltage samples and the set of measured current samples due to the CT saturation.

15. The method of claim 10, wherein determining the set of processed voltage samples based at least in part on the set of measured voltage samples further comprises:

receiving the set of measured voltage samples;

applying an averaging function to the set of measured voltage samples; and determining the set of processed voltage samples, wherein the set of processed voltage samples comprises an output of the averaging function.

16. The method of claim 10, wherein determining the set of processed reactive current samples and the set of processed resistive current samples based at least in part on the set of measured current samples further comprises:

receiving the set of measured current samples;

determining a set of processed resistive currents based at least in part on the set of measured current samples;

applying an averaging function to the set of processed resistive currents; and determining the set of processed resistive current samples, wherein the set of processed resistive current samples comprises an output of the averaging function.

17. The method of claim 16, wherein determining the set of processed reactive current samples and the set of processed resistive current samples based at least in part on the set of measured current samples further comprises:

receiving the set of measured current samples;

determining a set of processed reactive currents based at least in part on the set of measured current samples;

applying a differential function to the set of processed reactive currents; and determining the set of processed reactive current samples, wherein the set of processed reactive current samples comprises an output of the differential function.

18. A power systems network, comprising:

a power line, wherein a set of measured voltage samples and a set of measured current samples are associated with a section of the power line and collected over a first time window; and a fault located on the power line, wherein a set of processed voltage samples are determined based at least in part on the set of measured voltage samples, wherein a set of processed reactive current samples, a set of processed resistive current samples, a set of processed negative sequence current samples, and a set of processed zero sequence current samples are determined based at least in part on the set of measured current samples, wherein a selected processed voltage sample of the set of processed voltage samples, a selected processed reactive current sample of the set of processed reactive current samples, a selected processed resistive current sample of the set of processed resistive current samples, and a selected processed negative or zero sequence current sample of the set of processed negative current samples or the set of processed zero sequence current samples are selected based at least in part on an indication from a faulty phase indicator, wherein a determination that no distortion has occurred on the set of measured voltage samples and the set of measured current samples due to current transformer (CT) saturation is made based at least in part on the selected processed reactive current sample, detecting, based at least in part on a second set of measured voltage samples and a second set of measured current samples collected over a second time window, that CT saturation distortion is present during the second time window, and wherein a distance to the fault is calculated based at least in part on the determination that no distortion has occurred, the selected processed voltage sample, the selected processed reactive current sample, the selected processed resistive current sample, and the selected processed negative or zero sequence current sample, further wherein the distance of the fault is calculated without use of voltage and current samples collected from time windows in which the CT saturation distortion was detected.

19. The power systems network of claim 18, wherein the distance to the fault is calculated further based at least in part on a set of equations based at least in part on the set of measured voltage samples and the set of measured current samples, the selected processed voltage sample, the selected processed reactive current sample, the selected processed resistive current sample, and the selected processed negative or zero sequence current sample, the distance to the fault.

20. The power systems network of claim 18, wherein the determination that no distortion has occurred due to current transformer (CT) saturation based at least in part on the selected processed reactive current sample further comprises:

calculating, based at least in part on the selected processed reactive current sample, a full-cycle Fourier phasor current in a fraction of a full-cycle;

calculating a magnitude of the full-cycle Fourier phasor current;

calculating an average of the magnitude of the full-cycle Fourier phasor current for one-eighth of a cycle;

determining a difference between the average of the magnitude of the full-cycle Fourier phasor current for one-eighth of the cycle and a constant, wherein the constant is determined based at least in part on the magnitude of the full-cycle Fourier phasor current in the fraction of the full-cycle after an occurrence of the fault;

determining that the difference is less than a predetermined error threshold;

responsive to the determination that the difference is less than the predetermined error threshold, determining that no distortion has occurred due to the CT saturation; and outputting an output of "1" based on the determination that no distortion has occurred on the set of measured voltage samples and the set of measured current samples due to the CT saturation.

\* \* \* \* \*